United States Patent
Han (10) Patent No.: US 9,230,658 B2
(45) Date of Patent: *Jan. 5, 2016

(54) METHOD OF STORING DATA ON A FLASH MEMORY DEVICE

(71) Applicant: MICRON TECHNOLOGY, INC., Boise, ID (US)

(72) Inventor: Jin-Man Han, San Jose, CA (US)

(73) Assignee: MICRON TECHNOLOGY, INC., Boise, ID (US)

(*) Notice: Subject to any disclaimer, the term of this patent is extended or adjusted under 35 U.S.C. 154(b) by 7 days.

This patent is subject to a terminal disclaimer.

(21) Appl. No.: 14/073,776

(22) Filed: Nov. 6, 2013

(65) Prior Publication Data

US 2014/0063954 A1 Mar. 6, 2014

Related U.S. Application Data

(63) Continuation of application No. 13/546,944, filed on Jul. 11, 2012, now Pat. No. 8,595,423, which is a continuation of application No. 13/103,669, filed on May 9, 2011, now Pat. No. 8,230,165, which is a continuation of application No. 12/138,137, filed on Jun. 12, 2008, now Pat. No. 7,949,821.

(51) Int. Cl.
*G06F 13/00* (2006.01)
*G06F 13/28* (2006.01)
(Continued)

(52) U.S. Cl.
CPC ........ *G11C 16/10* (2013.01); *G11C 8/08* (2013.01); *G11C 16/3495* (2013.01); *G11C 2216/14* (2013.01)

(58) Field of Classification Search
CPC ... G11C 8/08; G11C 16/3495; G11C 2216/14

USPC ............. 711/103, 154, E12.008; 365/185.18
See application file for complete search history.

(56) References Cited

U.S. PATENT DOCUMENTS 4,893,281 A 1/1990 Hashimoto
5,592,669 A 1/1997 Robinson et al.
(Continued)

FOREIGN PATENT DOCUMENTS

CN 1971762 5/2007
CN 101461012 6/2009
(Continued)

OTHER PUBLICATIONS

Chinese Office Action of Jun. 24, 2013 for Chinese Application No. 200980122329.2 filed May 22, 2009. 3 pages, 1 page translation.
(Continued)

*Primary Examiner* — Edward Dudek, Jr.
(74) *Attorney, Agent, or Firm* — Knobbe Martens Olson & Bear LLP (57) ABSTRACT

Methods and apparatus are disclosed, such as those involving a flash memory device. One such method includes storing data on memory cells on a memory block including a plurality of word lines and a plurality of memory cells on the word lines. The word lines comprising one or more bottom edge word lines, one or more top edge word lines, and intermediate word lines between the bottom and top edge word lines. The data is stored first on memory cells on the intermediate word lines. Then, a remaining portion, if any, of the data is stored on memory cells on the bottom edge word lines and/or the top edge word lines. This method enhances the life of the flash memory by preventing a premature failure of memory cells on the bottom or top edge word lines, which can be more prone to failure.

23 Claims, 7 Drawing Sheets

(51) Int. Cl.
  *G11C 16/10* (2006.01)
  *G11C 8/08* (2006.01)
  *G11C 16/34* (2006.01)

(56) References Cited

U.S. PATENT DOCUMENTS

| | | |
|---|---|---|
| 6,236,594 B1 | 5/2001 | Kwon |
| 6,446,177 B1 | 9/2002 | Tanaka et al. |
| 6,731,540 B2 | 5/2004 | Lee et al. |
| 6,778,442 B1 | 8/2004 | Hamilton et al. |
| 6,930,919 B2 | 8/2005 | Lee et al. |
| 7,120,063 B1 | 10/2006 | Liu et al. |
| 7,170,788 B1 | 1/2007 | Wan et al. |
| 7,218,552 B1 | 5/2007 | Wan et al. |
| 7,239,556 B2 | 7/2007 | Abe et al. |
| 7,292,473 B2 | 11/2007 | Niset et al. |
| 7,301,815 B2 | 11/2007 | Kurata et al. |
| 7,421,557 B2 | 9/2008 | Lee et al. |
| 7,480,187 B2 | 1/2009 | Hwang |
| 7,518,920 B2 | 4/2009 | Kang et al. |
| 7,558,148 B2 | 7/2009 | Sukegawa et al. |
| 7,949,821 B2 * | 5/2011 | Han .................. 711/103 |
| 7,952,922 B2 | 5/2011 | Aritome |
| 8,230,165 B2 * | 7/2012 | Han .................. 711/103 |
| 8,595,423 B2 * | 11/2013 | Han .................. 711/103 |
| 2005/0174852 A1 | 8/2005 | Hemink |
| 2005/0210184 A1 | 9/2005 | Chen et al. |
| 2007/0094445 A1 | 4/2007 | Trika et al. |
| 2007/0106836 A1 | 5/2007 | Lee et al. |
| 2007/0115724 A1 | 5/2007 | Hwang |
| 2007/0211536 A1 | 9/2007 | Aritome |
| 2007/0247909 A1 * | 10/2007 | Kamei .................. 365/185.17 |
| 2008/0052447 A1 | 2/2008 | Sukegawa et al. |
| 2008/0175059 A1 | 7/2008 | Kim et al. |
| 2009/0043831 A1 * | 2/2009 | Antonopoulos et al. ...... 707/205 |
| 2009/0237999 A1 | 9/2009 | Li |
| 2012/0275230 A1 | 11/2012 | Han |

FOREIGN PATENT DOCUMENTS

| | | |
|---|---|---|
| CN | 102238465 | 11/2011 |
| JP | 62 084495 | 4/1987 |
| JP | 04 064998 | 2/1992 |
| JP | 06 139140 | 5/1994 |
| JP | 06 202937 | 7/1994 |
| JP | 2001-035170 | 2/2001 |
| JP | 2005-235260 | 9/2005 |
| JP | 2005-285313 | 10/2005 |
| JP | 2006-059481 | 3/2006 |
| JP | 2007-184090 | 7/2007 |
| JP | 2008-021394 | 1/2008 |
| JP | 2009-508286 | 2/2009 |
| TW | 536819 | 6/2003 |
| TW | 200506938 | 2/2005 |
| WO | WO 2006/093886 | 9/2006 |
| WO | WO 2007-30536 | 3/2007 |

OTHER PUBLICATIONS

European Office Action of Sep. 30, 2013 for European Patent Office Application No. 09 763 224. 7 pages.
Korean Office Action of Dec. 26, 2013 for Korean Patent Application No. 10-2011-7000765 filed on May 22, 2009. 2 pages, 1 page translation.
Chinese Search Report of Mar. 19, 2013 for Chinese Application No. 200980122329.2 filed May 22, 2009. 7 pages.
Extended Search Report of Aug. 3, 2011, European Patent Office Application No. EP 09 76 3224.
International Preliminary Report on Patentability in International Application No. PCT/US2009/045081, mailed Dec. 13, 2010.
International Search Report in International Application No. PCT/US2009/045081 dated Dec. 28, 2009.
Japanese Office Action of May 21, 2013 for Japanese Patent Application No. 2011-51344, filed May 22, 209, 8 pages.
Taiwanese Office Action of Jan. 9, 2015 for Taiwanese Patent Application No. 098118229, filed on Jun. 2, 2009. 6 pages, 5 page translation.
Office Action dated Jul. 6, 2015, received in Taiwan patent application No. 098118229.

* cited by examiner

METHOD OF STORING DATA ON A FLASH MEMORY DEVICE

CROSS-REFERENCE TO RELATED APPLICATIONS

This application is a continuation of U.S. patent application Ser. No. 13/546,944, filed Jul. 11, 2012, which is a continuation of U.S. patent application Ser. No. 13/103,669, filed May 9, 2011, issued as U.S. Pat. No. 8,230,165 on Jul. 24, 2012, which is a continuation of U.S. patent application Ser. No. 12/138,137, filed Jun. 12, 2008, issued as U.S. Pat. No. 7,949,821 on May 24, 2011, the disclosures of each of which are hereby incorporated by reference in their entireties herein.

BACKGROUND

1. Field of the Invention

Embodiments of the invention relate to memory devices, and more particularly, in one or more embodiments, to flash memory devices.

2. Description of the Related Art

Flash memory devices are non-volatile memory devices which store information on a semiconductor in a way that needs no power to maintain the information stored therein. Among flash memory devices, NAND flash memory devices have been widely used as mass-storage devices because of their high storage densities and low costs. In some applications, a NAND flash memory device serves as a solid state disk (SSD), replacing or supplementing a hard disk.

Figure 1:
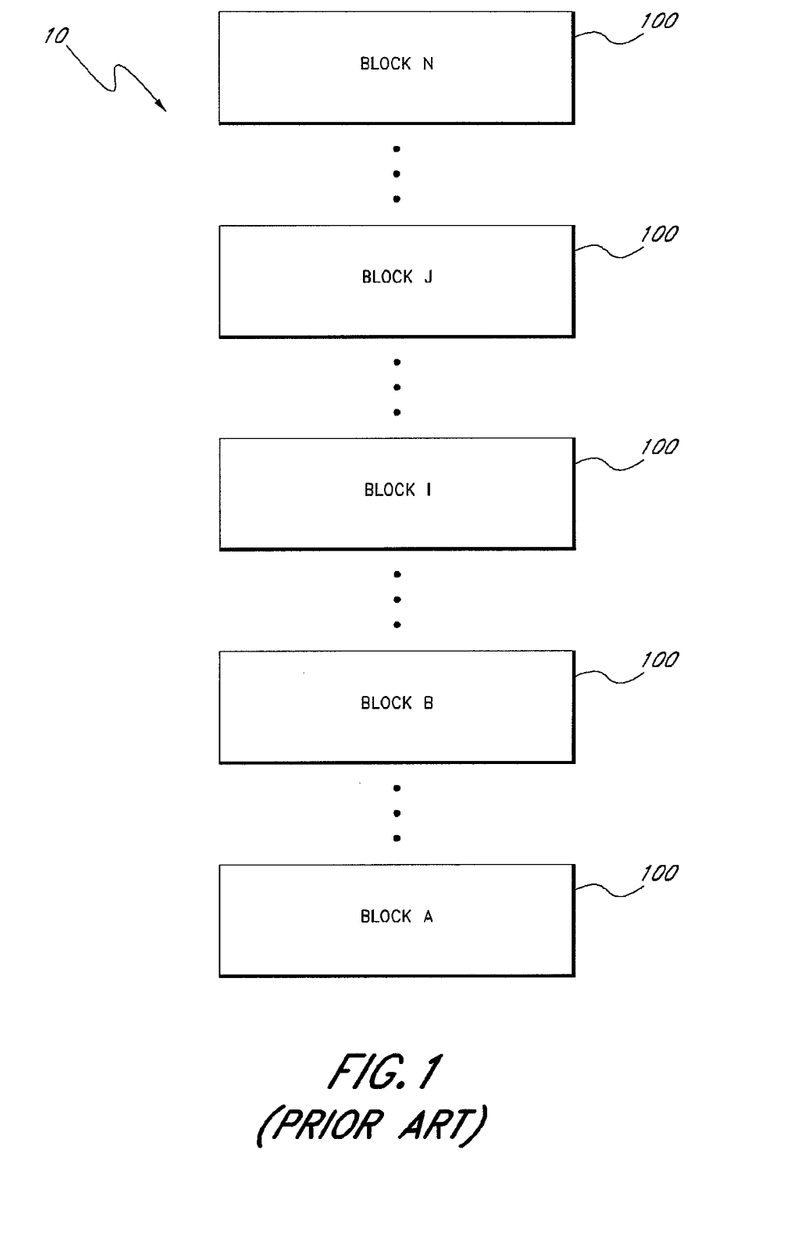
FIG. 1 is a schematic diagram of a conventional NAND flash memory device including a plurality of memory blocks.

Referring to FIG. 1, a conventional NAND flash memory device includes a plurality of memory blocks. The illustrated flash memory device 10 includes first to N-th memory blocks 100. Each of the memory blocks 100 includes a plurality of memory cells arranged in a matrix form.

Figure 2A:
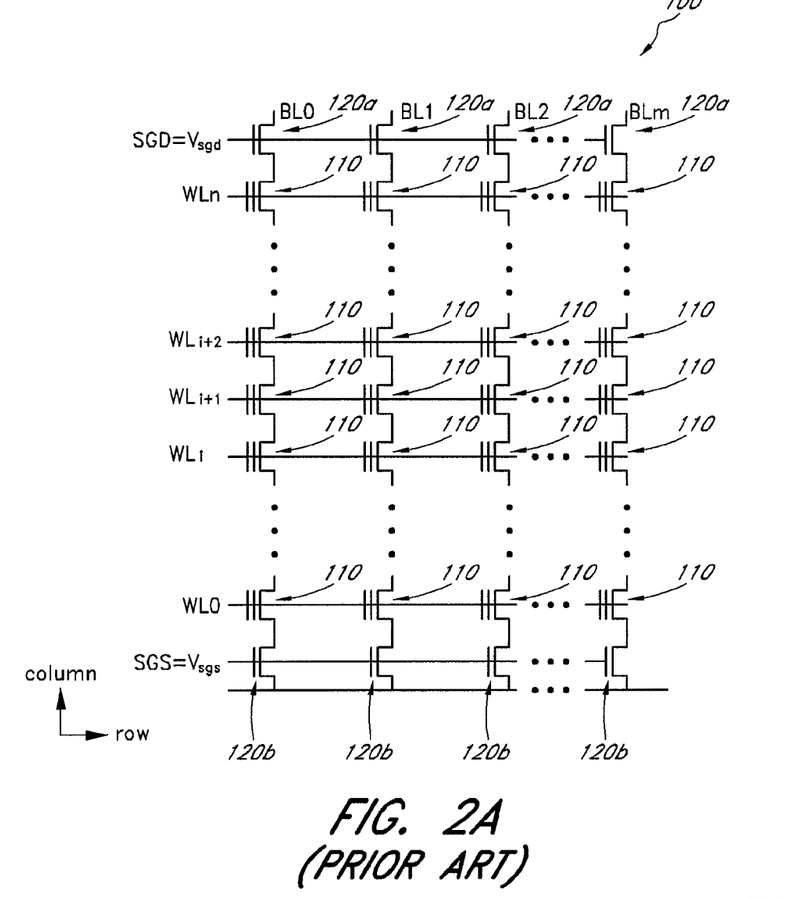
FIG. 2A is a schematic diagram of a memory block of a conventional NAND flash memory device.

FIG. 2A illustrates one of the memory blocks 100 of the NAND flash memory device 10 of FIG. 1. The illustrated memory block 100 includes first to m-th bit lines BL0-BLm and first to n-th word lines WL0-WLn. In some arrangements, m can be 32,767 or 65,535, and n can be 32 or 64. The bit lines BL0-BLm extend parallel to one another in a column direction. The word lines WL0-WLn extend parallel to one another in a row direction perpendicular to the column direction. The memory block 100 also includes upper and lower bit line select transistors 120a, 120b for selecting the one memory block 100 among the plurality of memory blocks of FIG. 1 by coupling the one memory block 100 to bit lines extending outside the memory block 100.

Each bit line includes a string of memory cells 110. For example, the second bit line BL1 includes memory cells 110 connected in series. Each of the memory cells 100 includes a floating gate transistor. The floating gate transistors of the memory cells 100 are coupled to one another in series source to drain. The control gates of the floating gate transistors of memory cells 110 in the same row are coupled to the same word line. Each of the memory cells 110 stores a charge (or a lack of charge), wherein the amount of stored charge can be used to represent, for example, one or more states, and wherein the one or more states can represent one or more digits (e.g., bits) of data. The memory cell can be either a single-level cell (SLC) or a multi-level cell (MLC). In one arrangement, the amounts of charge stored in the memory cells 110 may be detected by sensing currents flowing through the floating gate transistors of the memory cells 110. In another arrangement, the amounts of charge stored in the memory cells 110 may be detected by sensing the threshold voltage values of the floating gate transistors of the memory cells 110.

Figure 2B:
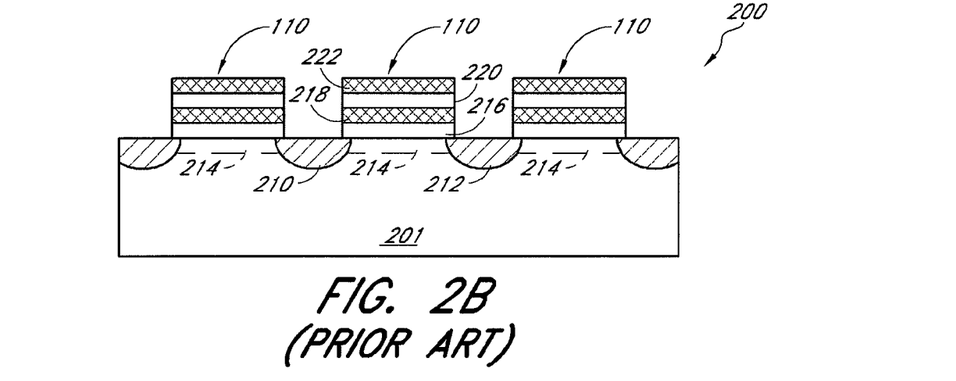
FIG. 2B is a schematic cross-section of the memory block of FIG. 2A.

FIG. 2B illustrates a cross-section of the floating gate transistors of the memory cells 110 in the second bit line BL1. The floating gate transistors are formed on a substrate 201. Each of the floating gate transistors includes a source region 210 (which is a drain region for a neighboring transistor), a drain region 212 (which is a source region for a neighboring transistor), a doped channel region 214, a first dielectric (e.g., a tunnel oxide) 216, a floating gate 218, a second dielectric (e.g., a gate oxide, wherein the tunnel and gate oxide can be formed of the same or different material) 220, and a control gate 222. The tunnel oxide 216 is formed on the channel region 214 to insulate the floating gate 218 from the channel region 214. The gate dielectric 220 physically and electrically separates the floating gate 218 from the control gate 222. The control gate 222 is coupled to an appropriate word line, e.g., word line WL1. Electrons can be trapped on the floating gate 218 and be used to store data.

Figure 2C:
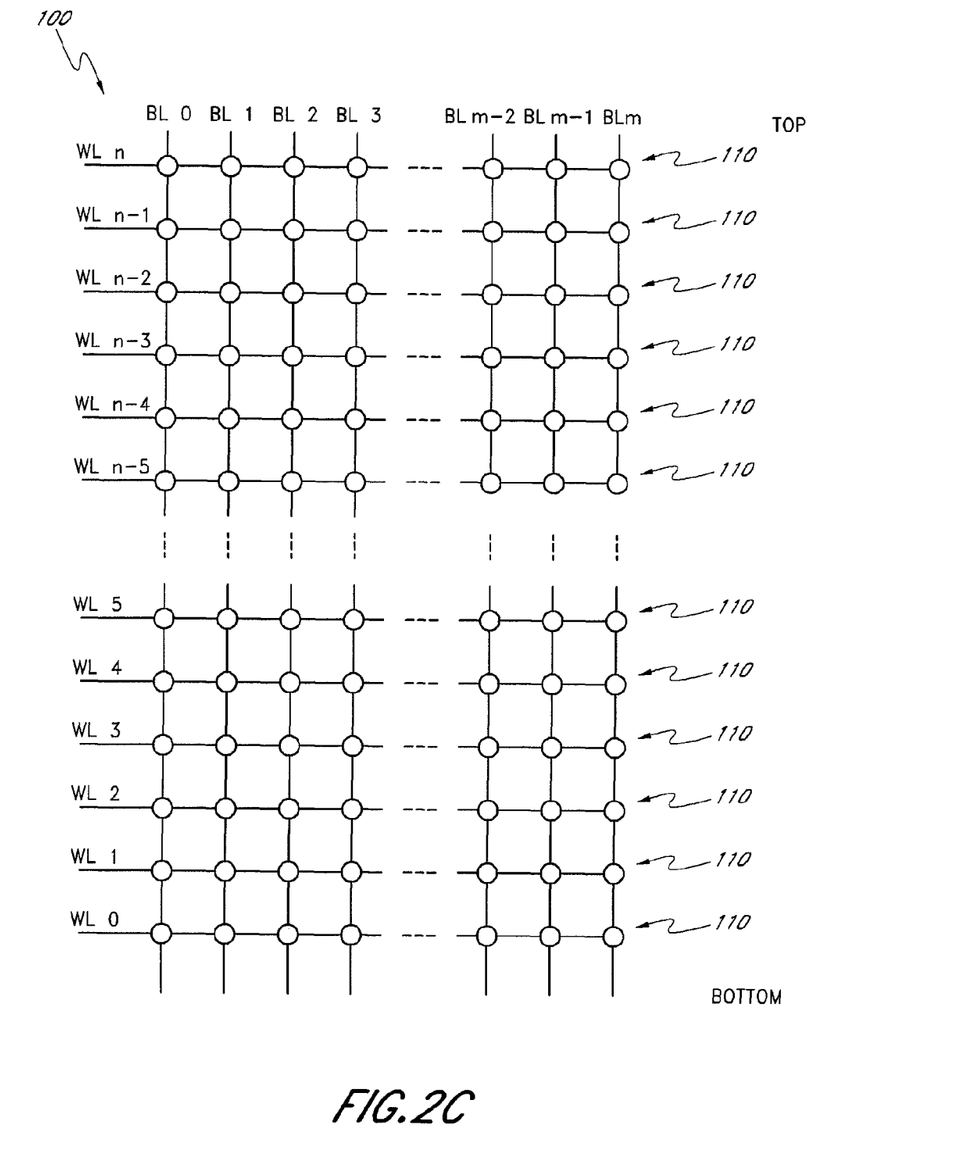
FIG. 2C is a schematic diagram illustrating a conventional method of storing data on a block of a NAND flash memory device.

Referring now to FIGS. 1 and 2C, a conventional method of writing data on a memory block will be described. FIG. 2C schematically illustrates the memory block 100 of FIG. 2A, and only shows memory cells, bit lines, and word lines. However, it will be understood that the memory block 100 can include other components as described above with respect to FIGS. 2A and 2B.

During a write operation of the NAND flash memory device 10 (FIG. 1), data is typically written on a set of memory cells on a single word line. Such a set of memory cells can be referred to as a "page." In one arrangement, a page may include all memory cells on a word line. In other arrangements, a page may be formed by every other memory cells on a single word line. In certain arrangements, a page may be formed by every fourth memory cells on a single word line. It will be understood that a page may be formed by any suitable selected number of memory cells on a word line.

On the other hand, an erase operation of the NAND flash memory device 10 (FIG. 1) is typically performed on a block-by-block basis. In other words, a page or memory cells cannot be selectively erased.

Likewise, when changing data values in some of memory cells in a memory block, the data values in the memory cells cannot be selectively changed. Instead, the entire memory block is erased and re-written (or programmed) with changed data values. For this process, data values stored in the entire memory block are copied to another memory block. For example, when some of data values in the I-th memory block are to be modified, the data values in the entire I-th memory block are copied to an unused memory block, for example, the J-th memory block. Subsequently, the data values in the entire I-th memory block are erased, and then updated data including unmodified and modified data values is written onto the erased I-th memory block.

BRIEF DESCRIPTION OF THE DRAWINGS

The embodiments will be better understood from the Detailed Description of Embodiments and from the appended drawings, which are meant to illustrate and not to limit the embodiments, and wherein.

DETAILED DESCRIPTION OF EMBODIMENTS

In certain applications (for example, when a NAND flash memory serves as a solid state disk), data is frequently written or modified on a NAND flash memory. Thus, at least some memory blocks in the NAND flash memory are subjected to a great number of programming cycles.

In a conventional write method, data is written on a memory block in a bottom-up fashion, starting from memory cells on or near the lowermost (or bottom) word line. Then, data is sequentially written page-by-page on memory cells on word lines above the lowermost word line until memory cells on the uppermost (or top) word line are filled up. For example, data is written first on memory cells 110 on the lowermost word line WL0, and last on memory cells 110 on the uppermost word line WLn in FIG. 2C. In other instances, data may be written first on memory cells 110 on the second lowermost word line WL1, then memory cells 110 on the lowermost word line WL0, and may be written on memory cells 110 on word lines above the second lowermost word line WL1 in a bottom-up fashion. In the context of this document, the phrase "memory cells on a word line" indicates that the memory cells are electrically connected to the word line for address selection, not necessarily indicating that the memory cells are physically on the word line.

In certain cases employing the conventional write method described above, at least one of the memory blocks in a NAND flash memory may not be completely filled up during write operations. In such cases, some of the memory cells may remain unprogrammed. For example, memory cells on or near the uppermost word line WLn of FIG. 2C may not be reprogrammed to store data. Even in such cases, memory cells on several lowermost word lines of the memory block are always subjected to a programming cycle whenever data is written onto the memory block. Thus, memory cells on or near the lowermost word line WL0 of the memory block experience the most number of programming cycles during the lifespan of the NAND flash memory device.

In addition, memory cells on or near the lowermost word line WL0 or the uppermost word line WLn are most vulnerable to damage because they are adjacent to bit line select transistors. For example, in FIG. 2A, memory cells on or near the lowermost word line WL0 and uppermost word lines WLn are adjacent to the lower bit line select transistors 120b and the upper bit line select transistors 120a, respectively. It is well known in the state-of-the-art NAND flash memory industry that these memory cells experience more GIDL (Gate Induced Drain Leakage) and more charge trap-up than other memory cells in the memory block. Because of this inherent vulnerability in addition to more frequent exposure to programming cycles, these memory cells tend to fail before the other memory cells fail, rendering the entire block useless.

In one embodiment, during a write operation, data is written first on memory cells on word lines that are not adjacent to the uppermost word line or the lowermost word line. Then, if there is a remaining portion of the data, the remaining portion is written on memory cells on or near the uppermost word line and/or the lowermost word line. Because the entire memory block is not always filled up, this write scheme exposes the memory cells on or near the uppermost word line or the lowermost word line to less frequent programming cycles than the conventional method described above with respect to FIG. 2C. Thus, the write scheme may prevent the memory cells on or near the uppermost word line WLn or the lowermost word line WL0 from prematurely failing, thereby lengthening the life of the memory block, and ultimately the life of the NAND flash memory device.

On the other hand, memory cells that are not on or near the uppermost word line or the lowermost word line are less vulnerable to damage than those on or near the uppermost word line or the lowermost word line. Thus, more frequent exposure of these memory cells to programming cycles does not necessarily shorten the lives of these memory cells.

Figure 3:
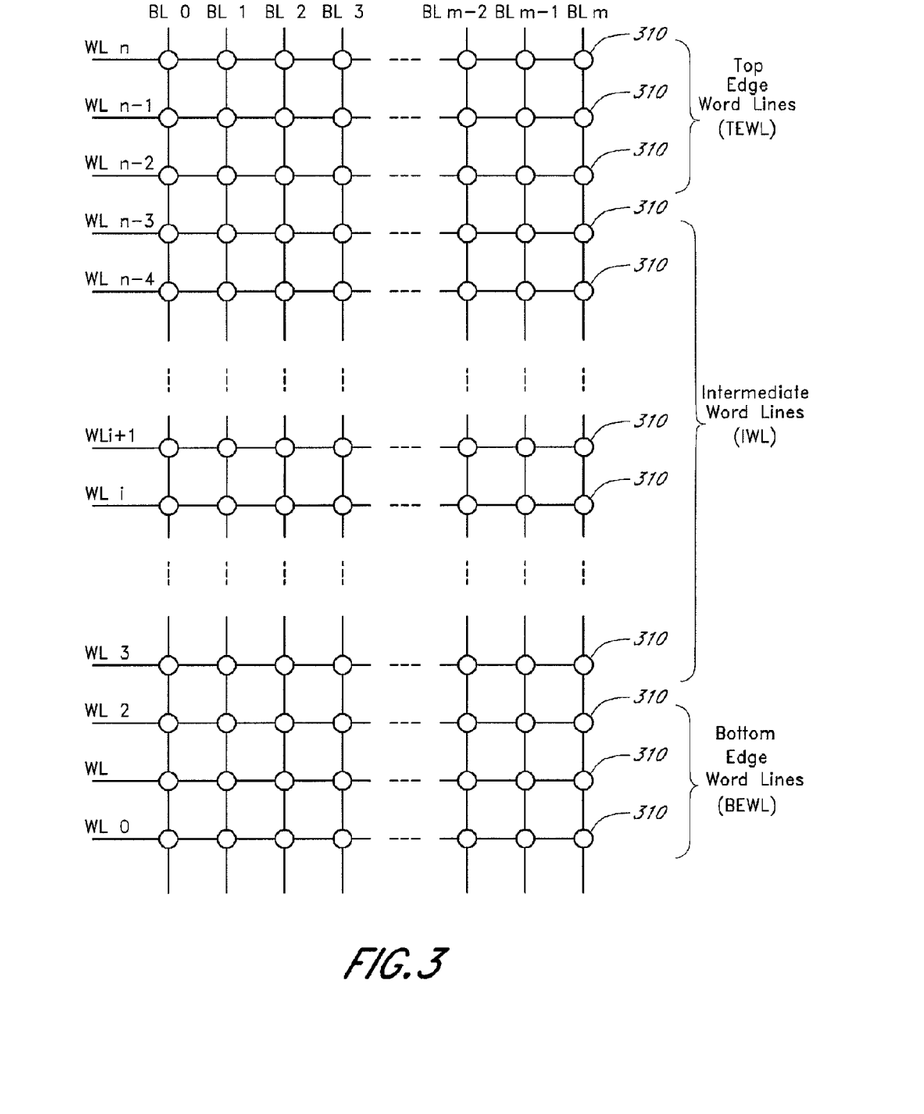
FIG. 3 is a schematic diagram illustrating one embodiment of a method of storing data on a block of a NAND flash memory device.

Referring to FIG. 3, a method of storing data on a memory block of a NAND flash memory device according to one embodiment will be described below. The illustrated memory block 300 includes word lines WL0-WLn, bit lines BL0-BLm, and memory cells 310 at the intersections of the word lines WL0-WLn and the bit lines BL0-BLm. The detailed configuration of the memory block 300 can be as described earlier in connection with the memory block 100 of FIG. 2A.

In the context of this document, the lowermost word line WL0 and optionally a number of word lines immediately adjacent to the lowermost word line WL0 are collectively referred to as bottom edge word lines (BEWL). In one embodiment, the bottom edge word lines can be the word lines WL0 to WL4. In another embodiment, the bottom edge word lines can be the word lines WL0 to WL3. In yet another embodiment, the bottom edge word lines can be the word lines WL0 to WL2. In yet another embodiment, the bottom edge word lines can be the word lines WL0 and WL1. In yet another embodiment, the bottom edge word line can be the word line WL0 only. In other embodiments, the bottom edge word lines can include other word lines adjacent to the lowermost word line WL0.

In the context of this document, the uppermost word line WLn and optionally a number of word lines immediately adjacent to the uppermost word line WLn are collectively referred to as top edge word lines (TEWL). In one embodiment, the top edge word lines can be the word lines WLn to WLn–4. In another embodiment, the top edge word lines can be the word lines WLn to WLn–3. In yet another embodiment, the top edge word lines can be the word lines WLn to WLn–2. In yet another embodiment, the top edge word lines can be the word lines WLn to WLn–1. In yet another embodiment, the top edge word line can be the word lines WLn only. In other embodiments, the top edge word lines can include other word lines adjacent to the uppermost word line WLn.

The number of the top edge word lines may be the same as the number of the bottom edge word lines. In another embodiment, the number of the top edge word lines may be different from the number of the bottom edge word lines. The numbers of the top and bottom edge word lines can be determined during a manufacturing process by, for example, testing sample NAND flash memory devices.

Further, word lines that are neither a top edge word line nor a bottom edge word line are collectively referred to as intermediate word lines (IWL) in the context of this document. The intermediate word lines are positioned between the top edge word lines and the bottom edge word lines. The number of the intermediate word lines is equal to the total number of all the word lines less the total number of the top and bottom edge word lines in the memory block.

In one embodiment, during a write operation, data is written first onto memory cells on the intermediate word lines IWL, and if there is remaining data, then onto memory cells on the bottom edge word lines BEWL, and finally onto memory cells on the top edge word lines TEWL. In another embodiment, during a write operation, data is written first onto memory cells on the intermediate word lines IWL, and if there is remaining data, then onto memory cells on the top edge word lines TEWL, and finally onto memory cells on the bottom edge word lines BEWL.

The memory cells on the intermediate word lines IWL can be programmed in a bottom-up fashion, starting from memory cells on the lowest word line among the intermediate word lines IWL. For example, memory cells on the lowest of the intermediate word lines IWL can be programmed first, and memory cells on the highest of the intermediate word lines IWL can be programmed last while memory cells on the other intermediate word lines therebetween can be sequentially programmed line-by-line from bottom to top. In an example shown in FIG. 3 where the bottom and top edge word lines BEWL and TEWL are three (3) word lines at the bottom and top edges, respectively, (i.e., BEWL are WL0, WL1, and WL2; and TEWL are WLn, WLn−1, and WLn−2), the fourth word line WL3 may be programmed first, and then intermediate word lines above the fourth word line WL3 may be sequentially programmed line-by-line until the (n−3)-th word line WLn−3 is programmed. In another embodiment, the memory cells on the intermediate word lines IWL can be programmed in a top-down fashion. A skilled artisan will appreciate that the sequence of programming among the intermediate word lines can vary widely.

The memory cells on the bottom edge word lines BEWL can be programmed in a top-down fashion, starting from memory cells on the highest word line among the bottom edge word lines BEWL. For example, memory cells on the highest of the bottom edge word lines BEWL can be programmed first, and memory cells on the lowest of the bottom edge word lines BEWL can be programmed last while memory cells on word lines therebetween can be sequentially programmed from top to bottom. In the example shown in FIG. 3, the third word line WL2 may be programmed first, and then the second and first word lines WL1, WL0 below the third word line WL2 may be sequentially selected for being programmed. In another embodiment, the memory cells on the bottom edge word lines BEWL can be programmed in a bottom-up fashion. A skilled artisan will appreciate that the sequence of programming among the bottom edge word lines can vary widely.

The memory cells on the top edge memory cells TEWL can be programmed in a bottom-up fashion, starting from memory cells on the lowest of the top edge word lines. For example, memory cells on the lowest of the top edge word lines TEWL can be programmed first, and memory cells on the highest of the top edge word lines TEWL can be programmed last while memory cells on word lines therebetween can be sequentially programmed from bottom to top. In the example shown in FIG. 3, the (n−2)-th word line WLn−2 may be programmed first, and then the (n−1)-th and n-th word lines WLn−1, WLn may be sequentially selected for being programmed. In another embodiment, the memory cells on the top edge memory cells TEWL can be programmed in a top-down fashion. A skilled artisan will appreciate that the sequence of programming among the top edge word lines can vary widely.

In yet another embodiment where the edge word lines BEWL, TEWL include two or more word lines, writing data on the memory cells on the bottom edge word lines BEWL and the top edge word lines TEWL can be alternated. In the example shown in FIG. 3, writing data on the memory cells on these word lines can be performed in the following sequence: WL2, WLn−2, WL1, WLn−1, WL0, and WLn; or WLn−2, WL2, WLn−1, WL1, WLn, and WL0. A skilled artisan will appreciate that these sequences can vary widely.

In this manner, the memory cells on the bottom and top edge word lines TEWL, BEWL are less frequently subjected to programming cycles when the memory block is not always completely filled up during write operations. On the other hand, the memory cells on the intermediate word lines IWL can be subjected to more programming cycles than memory cells on either the bottom or top edge word lines TEWL or BEWL. However, because the memory cells on the intermediate word lines IWL are less vulnerable to damage than those on the bottom and top edge word lines TEWL, BEWL, more frequent exposure of these memory cells to programming cycles does not necessarily shorten the lives of these memory cells. Thus, the overall life of the memory block, and ultimately the life of the NAND flash memory can be lengthened.

Figure 4A:
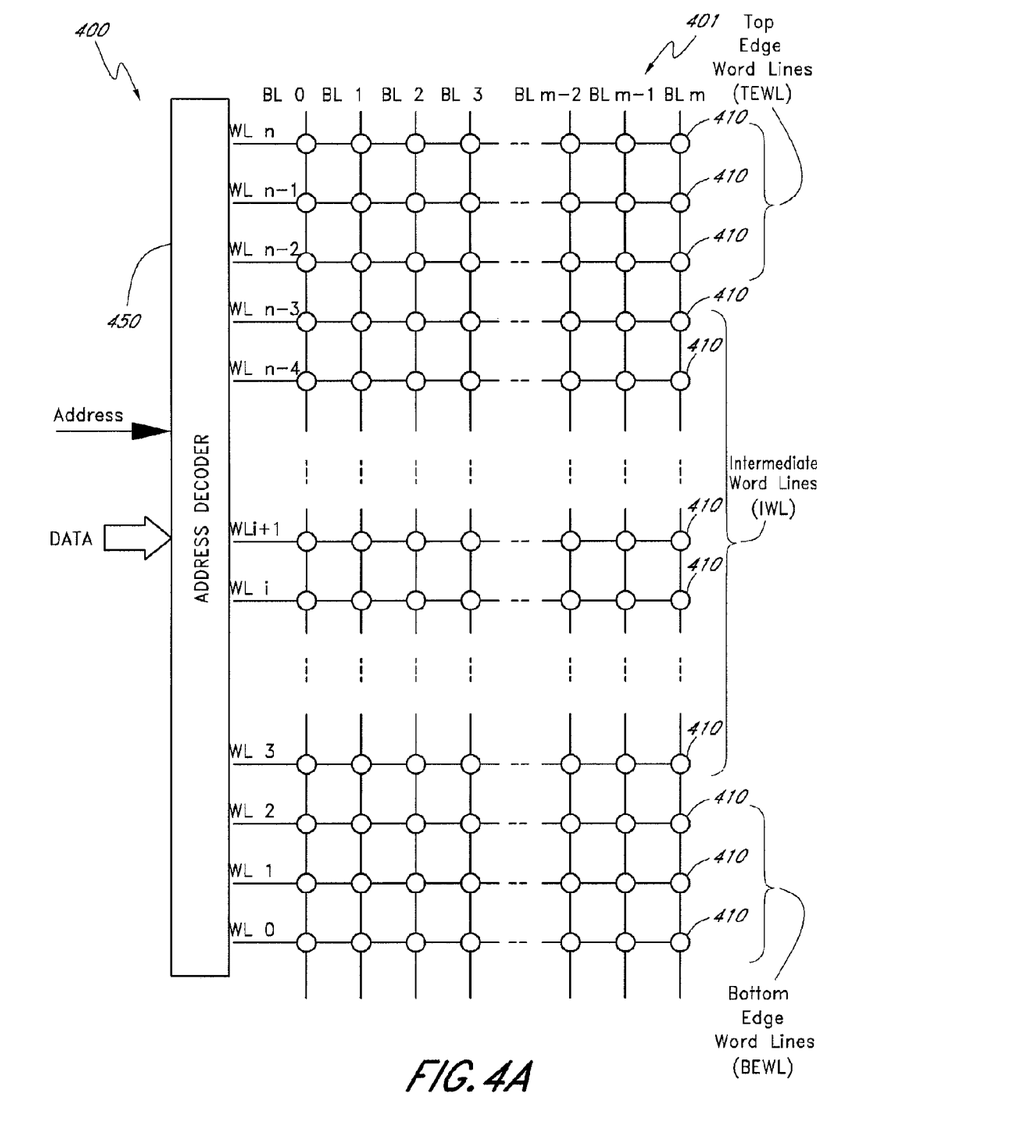
FIG. 4A is a schematic block diagram of a NAND flash memory device including an address decoder for changing word line addresses according to one embodiment.
Figure 4B:
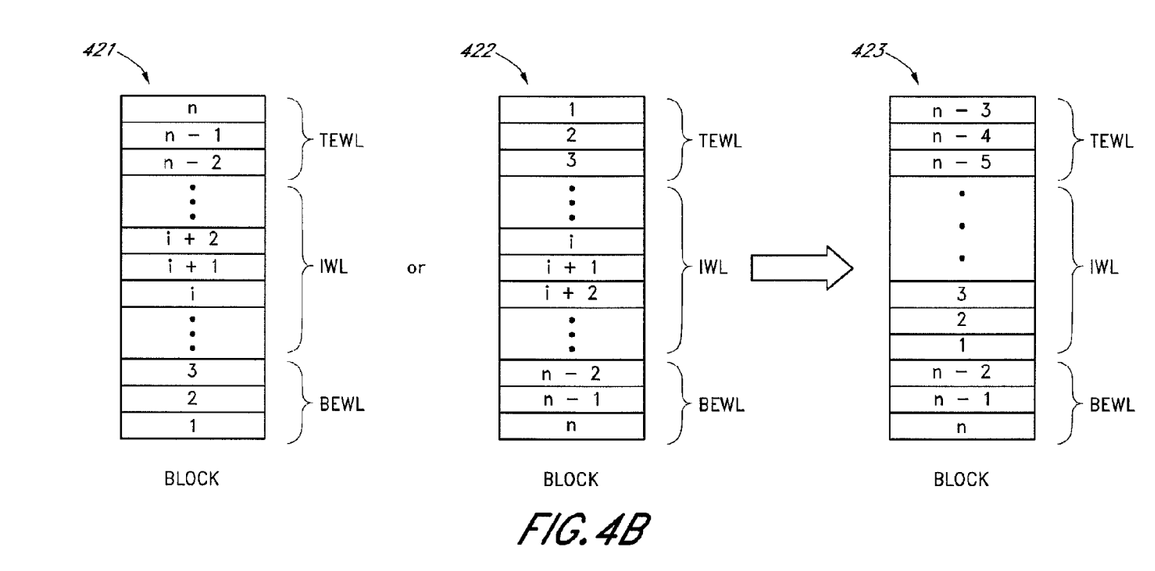
FIG. 4B is a schematic block diagram illustrating a method of mapping word lines addresses by the address decoder of FIG. 4A.
Figure 4C:
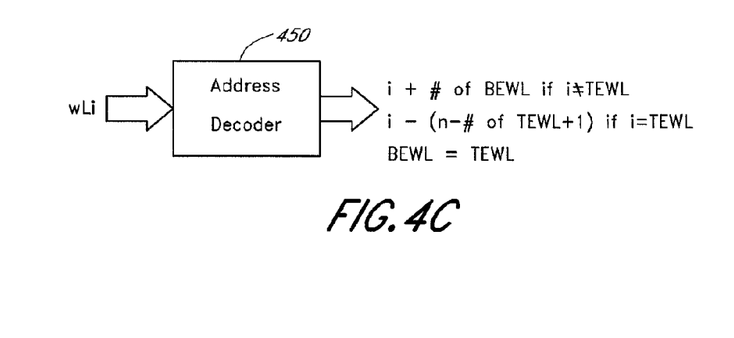
FIG. 4C is a schematic block diagram illustrating the function of the address decoder of FIG. 4A.

Referring to FIGS. 4A-4C, one embodiment of a NAND flash memory device employing the method described above in connection with FIG. 3 will be described below. The NAND flash memory device 400 includes a memory block 401 and a decoder 450.

The memory block 401 includes word lines WL0-WLn−1, bit lines BL0-BLm, and a plurality of memory cells 410 in a matrix form. The detailed configuration of these components can be as described above in connection with FIG. 2A.

The address decoder 450 receives addresses from an external memory controller (not shown). The addresses are generated by the memory controller, and designate the addresses of memory cells where values of the data are to be stored. The controller may be of any suitable type (for example, a microprocessor or CPU) that can be used for providing data read and/or write instructions to a NAND flash memory device. Thus, the controller generates the addresses in a conventional manner, in other words, in a bottom-up fashion to program memory cells first on the lowermost word lines and sequentially upward, as shown in a memory block 421 in FIG. 4B. The numbers in the block 421 indicate the sequence of addresses for a write operation. In certain embodiments, the controller may generate the addresses in a reverse manner, in other words, in a top-down fashion to program memory cells first on the uppermost word lines and sequentially downward, as shown in a memory block 422 in FIG. 4B. The numbers in the block 422 indicate the sequence of addresses for a write operation.

In the illustrated embodiment, the address decoder 450 maps the incoming addresses from the external memory controller to implement the method described above in connection with FIG. 3. The address decoder 450 may map the received addresses such that a write operation is performed in the order of the intermediate word lines, the top edge word lines, and the bottom edge word lines, as shown in a memory block 423 in FIG. 4B. The numbers in the block 423 indicate the sequence of addresses for a write operation. In the illustrated embodiment, the number of the bottom edge word lines is the same as the number of the top edge word lines.

In the illustrated embodiment, a word line address i is mapped into i+the number of bottom edge word lines if i does not indicate a top edge word line (TEWL). If a word line address i indicates a top edge word line (TEWL), i is mapped into i−(n+1−the number of the bottom edge word lines), as shown in FIG. 4C. The address decoder 450 includes a plurality of logic gates to map incoming addresses as described above. The logic gates may be hard-wired to map incoming addresses in the manner described above. A skilled artisan will appreciate that various schemes can be used at the address decoder 450 or any other component in the NAND flash memory device 400 for implementing any of the embodiments described above in connection with FIG. 3.

Figure 5:
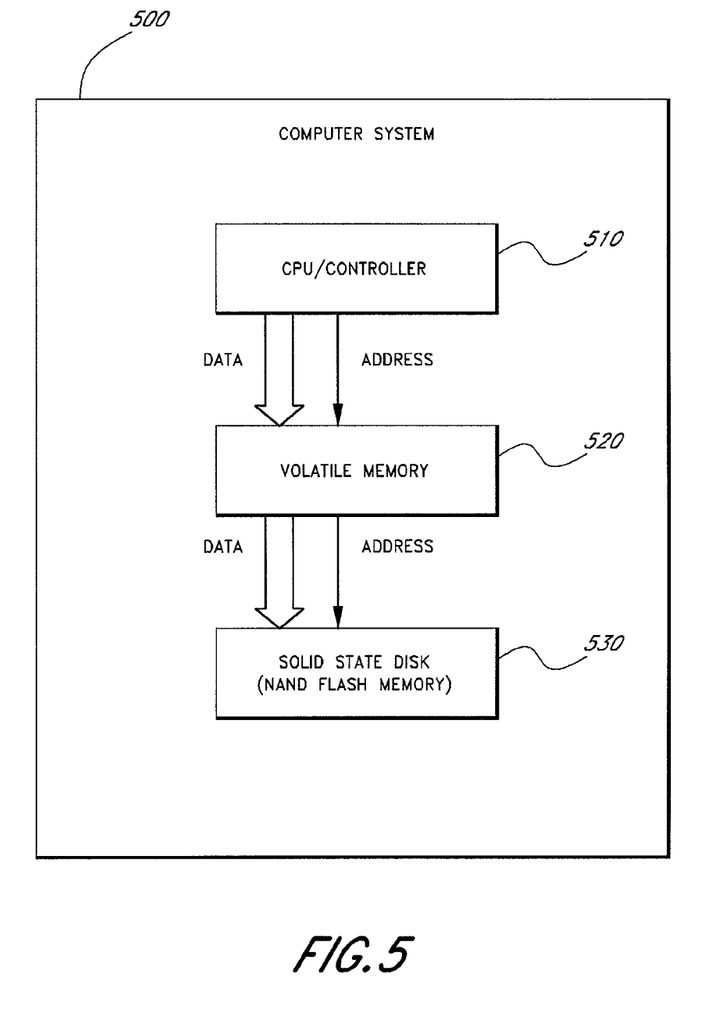
FIG. 5 is a schematic block diagram of a computer system including a controller employing the method of FIG. 3.

Referring to FIG. 5, one embodiment of a computer system employing the method described above in connection with FIG. 3 for storing data in a NAND flash memory-based solid state disk will be described below. The illustrated computer system 500 includes a central processing unit (CPU) (or a controller) 510, a volatile memory 520, and a solid state disk 530. Although not illustrated, the computer system 500 may also include other components such as a user interface, peripheral devices, and a hard disk.

The CPU 510 can be of any suitable type, and have any suitable processing speed. The volatile memory 520 can also be of any suitable type and have any suitable data transfer rate. The solid state disk 530 can include a NAND flash memory device which may include a plurality of memory blocks as described above with reference to FIG. 1. The NAND flash memory device can also include an address decoder and other components for the operation of the NAND flash memory device. The NAND flash memory device can be any suitable commercially available NAND flash memory.

In the illustrated embodiment, the CPU 510 is configured to generate word line addresses such that data is stored in the solid state disk 530 in any of the write sequences described earlier in connection with FIG. 3. The CPU 510 then sends the volatile memory 520 the word line addresses along with bit line addresses and data. The volatile memory 520 temporarily stores the word line and bit line addresses and data, and then relays them to the solid state disk 530.

The solid state disk 530 stores the data in one or more memory blocks therein according to the addresses provided by the CPU 510 via the volatile memory 520. Because the word lines are mapped such that memory cells on the intermediate word lines are written or read first, the solid state disk 530 can store the data in the manner described earlier in connection with FIG. 3 without modifying or changing the addresses at the input of address decoder of the solid state disk 530.

In some embodiments, the solid state disk 530 may request the CPU 510 to provide word line addresses in the fashion described above at the start of operation. In certain embodiments, the solid state disk 530 can contain information on desired numbers of the top and bottom edge word lines of its memory blocks. The desired numbers of the top and bottom edge word lines can vary, depending on the flash memory device in the solid state disk 530. The solid state disk 530 may send the information to the CPU 510 via the volatile memory 520. Upon receiving the information, the CPU 510 can generate word line addresses based at least partly on the information. A skilled artisan will appreciate that various schemes can be used to instruct the CPU 510 to generate word line addresses as described above.

In the methods of the embodiments described above, memory cells on intermediate word lines are programmed more frequently than those on bottom and top edge word lines. Because the memory cells on intermediate word lines are more durable than those on the bottom or top edge word lines, the methods can prevent a premature failure of memory blocks that may occur in the conventional write method described above with reference to FIG. 2C.

The embodiments above are described in the context of NAND flash memory devices. The embodiments can also be adapted for other types of memory devices. In addition, the embodiments above can be adapted for any other types of solid state memory devices that have similar problems described above due to their write methods and inherent vulnerability of certain memory cells to damages.

A flash memory device according to the embodiments described above can be incorporated in various electronic devices. Examples of the electronic devices can include, but are not limited to, consumer electronic products, electronic circuits, electronic circuit components, parts of the consumer electronic products, electronic test equipments, etc. Examples of the consumer electronic products include, but are not limited to, a mobile phone, a telephone, a television, a computer monitor, a computer, a portable memory device (e.g., USB drive), a solid state disk, a hand-held computer, a personal digital assistant (PDA), a microwave, a refrigerator, a stereo system, a cassette recorder or player, a DVD player, a CD player, a VCR, an MP3 player, a radio, a camcorder, an optical camera, a digital camera, a washer, a dryer, a washer/dryer, a copier, a facsimile machine, a scanner, a multi functional peripheral device, a wrist watch, a clock, a game device, etc. Further, the electronic device can include unfinished products.

One embodiment is a method of arranging data within a block of a flash memory device. The block includes a plurality of word lines and a plurality of memory cells of the word lines. The word lines include one or more bottom edge word lines, one or more top edge word lines, and intermediate word lines between the bottom and top edge word lines. The method includes mapping data to be stored such that initial data of a block is stored on at least one of memory cells on the intermediate word lines of the block before storing to one or more bottom edge word lines or one or more top edge word lines of the block; and mapping at least a portion of subsequent data, if any, to be stored on memory cells on the one or more bottom edge word lines and/or the one or more top edge word lines.

Another embodiment is a flash memory device including one or more memory blocks. Each of the memory blocks includes a plurality of word lines having a plurality of memory cells. The word lines extend parallel to one another in a direction. The word lines include one or more bottom edge word lines, one or more top edge word lines, and intermediate word lines interposed between the bottom and top edge word lines. The memory device also includes an address decoder configured to map data to be stored such that initial data of a block is stored on at least one of memory cells on the intermediate word lines of the block before storing to the one or more bottom edge word lines or the one or more top edge word lines of the block. The address decoder is further configured to map at least a portion of subsequent data, if any, to be stored on the one or more bottom edge word lines and/or the one or more top edge word lines of the block.

Yet another embodiment is a computer system including: a controller; and a flash memory device configured to receive addresses for storing data therein. The flash memory device includes one or more memory blocks. Each of the memory blocks includes a plurality of word lines and a plurality of memory cells of the word lines. The word lines extend parallel to one another in a direction. The word lines include one or more bottom edge word lines, one or more top edge word lines, and intermediate word lines interposed between the bottom and top edge word lines. The controller is configured to generate the addresses such that the addresses are indicative of a write sequence to store an initial portion of the data on memory cells on the intermediate word lines of one of the blocks, and to store a subsequent portion, if any, of the data on memory cells on the bottom and/or top edge word lines of the one of the blocks.

Yet another embodiment is an apparatus including: a controller configured to generate a set of word line addresses for storing data in a flash memory device. The flash memory device includes one or more memory blocks. Each of the memory blocks includes a plurality of word lines and a plurality of memory cells of the word lines. The word lines extend parallel to one another in a direction. The word lines include one or more bottom edge word lines, one or more top edge word lines, and intermediate word lines interposed between the bottom and top edge word lines. The set of word line addresses is indicative of a write sequence to store an initial portion of the data on memory cells on the intermediate word lines of one of the blocks, and to store a subsequent portion, if any, of the data on memory cells on the bottom and/or top edge word lines of the one of the blocks.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

I claim:

1. A method of arranging data within a block of a non-volatile memory device, wherein the block comprises word lines each electrically coupled to memory cells configured to store data, the word lines comprising one or more first end word lines, one or more second end word lines, and intermediate word lines between the first and second end word lines, wherein the first end word lines and second end word lines are disposed at opposing ends of the block, the method comprising:
   programming the memory cells electrically coupled to the intermediate word lines; and
   programming the memory cells electrically coupled to the one or more first end word lines and the memory cells electrically coupled to the one or more second end word lines,
   wherein, when less than the entire memory block is programmed with data during operation of the non-volatile memory device, data is programmed to the memory cells electrically coupled to the intermediate word lines more frequently than to the memory cells electrically coupled to the one or more first end word lines and more frequently than to the memory cells electrically coupled to the one or more second end word lines.

2. The method of claim 1, wherein the one or more second end word lines comprise at least two word lines.

3. The method of claim 2, wherein programming the memory cells electrically coupled to the one or more first end word lines and the memory cells electrically coupled to the one or more second end word lines comprises:
   programming a portion of data to the memory cells electrically coupled to a first end word line closest to the intermediate word lines and subsequently programming another portion of the data to a different word line of the first end word lines.

4. The method of claim 1, wherein programming the memory cells electrically coupled to the intermediate word lines is performed prior to programming data to the memory cells electrically coupled to any of the one or more first end word lines or to the memory cells electrically coupled to any of the one or more second end word lines.

5. The method of claim 1, further comprising converting a first word line address into a second word line address, wherein the first word line address is indicative of a first write sequence to program first to the memory cells electrically coupled to one of the first or second end word lines, and wherein the second word line address is indicative of a second write sequence to program to the memory cells electrically coupled to one of the intermediate word lines.

6. The method of claim 1, wherein the one or more first end word lines consist of 1 to 5 word lines, and wherein the one or more second end word lines consist of 1 to 5 word lines.

7. The method of claim 1, wherein the non-volatile memory device comprises NAND flash memory.

8. The method of claim 1, wherein the same type of write operation is used to program data to the memory cells electrically coupled to the intermediate word lines as to program data to the memory cells electrically coupled to the one or more first end word lines and the one or more second end word lines.

9. The method of claim 1, wherein the memory cells electrically coupled to the one or more first end word lines, the memory cells electrically coupled to the one or more second end word lines, and the memory cells electrically coupled to the intermediate word lines each comprise single-level cells or each comprise multi-level cells.

10. The method of claim 1, wherein the memory cells electrically coupled to the one or more first end word lines and the memory cells electrically coupled to the one or more second end word lines each comprise multi-level cells.

11. A flash memory device comprising:
   a memory block comprising word lines each electrically coupled to a plurality of flash memory cells, the word lines comprising one or more first end word lines, one or more second end word lines, and intermediate word lines disposed between the first and second end word lines, wherein the one or more first end word lines and the one or more second end word lines are disposed at opposing ends of the memory block, and wherein flash memory cells electrically connected to the one or more first end word lines are configured to store data and flash memory cells electrically connected to the one or more second end word lines are configured to store data; and
   an address decoder configured to map addresses received by the flash memory device such that data is programmed to the memory block in a sequence in which an initial portion of the data is programmed to one or more intermediate word lines before any other data is programmed to the memory block and a subsequent portion of the data is subsequently programmed to at least one of the first or second end word lines.

12. The device of claim 11, wherein the address decoder is configured to map addresses such that data is programmed to each of the intermediate word lines prior to the subsequent portion of the data being programmed to at least one of the first or second end word lines.

13. The device of claim 11, wherein the address decoder is configured, when less than the entire memory block is programmed with data during operation of the flash memory device, to cause data to be programmed to memory cells electrically coupled to intermediate word lines more frequently than to memory cells electrically coupled to the one or more first end word lines and more frequently than to memory cells electrically coupled to the one or more second end word lines.

14. The device of claim 11, wherein the one or more first end word lines comprise 1 to 3 word lines and the one or more second end word lines comprise 1 to 3 word lines.

15. The device of claim 11, wherein the one or more first end word lines comprise 2 to 5 word lines.

16. The device of claim 11, wherein each of the memory cells of the block is configured as a single-level cell.

17. The device of claim 11, wherein the memory cells electrically coupled to the first and second end word lines comprise multi-level cells.

18. An apparatus comprising:
a controller configured to cause a solid state memory device to program data to a memory block, the memory block comprising word lines each electrically coupled to memory cells configured to store data, the word lines comprising one or more bottom edge word lines each electrically coupled to respective memory cells configured to store data, one or more top edge word lines each electrically coupled to respective memory cells configured to store data, and intermediate word lines disposed between the bottom and top edge word lines each electrically coupled to respective memory cells configured to store data,
wherein the controller is configured to cause the solid state memory device to program an initial portion of data to memory cells electrically connected to one or more of the intermediate word lines of the memory block first and to subsequently program another portion of the data to memory cells electrically coupled to at least one of the bottom or top edge word lines of the memory block.

19. The apparatus of claim 18, wherein the controller is configured, when less than the entire memory block is programmed with data during operation of the solid state memory device, to cause data to be programmed to memory cells electrically coupled to intermediate word lines more frequently than to memory cells electrically coupled to the one or more top edge word lines and more frequently than to memory cells electrically coupled to the one or more bottom edge word lines.

20. The apparatus of claim 18, wherein the one or more top edge word lines comprise 1 to 5 word lines.

21. The apparatus of claim 18, wherein the solid state memory device comprises a NAND flash memory device.

22. The apparatus of claim 18, wherein the controller is configured to direct the solid state memory to perform the same type of write operation to program data to the intermediate word lines as to program data to the one or more top edge word lines and the one or more bottom edge word lines.

23. The apparatus of claim 18, wherein the one or more bottom edge word lines comprise 2 to 5 word lines.

* * * * *